(12) United States Patent
Kwon et al.

(10) Patent No.: US 11,454,581 B2
(45) Date of Patent: Sep. 27, 2022

(54) MOLECULE DETECTING APPARATUS

(71) Applicant: Kabushiki Kaisha Toshiba, Minato-ku (JP)

(72) Inventors: Honam Kwon, Kawasaki (JP); Ikuo Fujiwara, Yokohama (JP); Kazuhiro Suzuki, Meguro (JP); Keita Sasaki, Yokohama (JP); Yuki Nobusa, Yokohama (JP); Yasushi Shinjo, Kawasaki (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 179 days.

(21) Appl. No.: 16/557,056

(22) Filed: Aug. 30, 2019

(65) Prior Publication Data

US 2020/0256778 A1    Aug. 13, 2020

(30) Foreign Application Priority Data

Feb. 7, 2019    (JP) .............................. JP2019-020741

(51) Int. Cl.
*G01N 15/02* (2006.01)
*G01N 21/64* (2006.01)
(Continued)

(52) U.S. Cl.
CPC ........... *G01N 15/0205* (2013.01); *C07F 3/06* (2013.01); *G01N 21/64* (2013.01); *G01N 21/77* (2013.01);
(Continued)

(58) Field of Classification Search
CPC .... G01N 15/0205; G01N 21/77; G01N 21/64; G01N 2021/773; G01N 2021/7763;
(Continued)

(56) References Cited

U.S. PATENT DOCUMENTS

| 6,197,503 | B1 * | 3/2001 | Vo-Dinh | ............ | B01J 19/0046 |
| | | | | | 435/183 |
| 8,368,159 | B2 * | 2/2013 | Dautet | ................. | H01L 31/107 |
| | | | | | 257/438 |

(Continued)

FOREIGN PATENT DOCUMENTS

| EP | 0354204 A2 * | 2/1990 | .......... G01N 21/643 |
| JP | 2006-507507 A | 3/2006 | |

(Continued)

OTHER PUBLICATIONS

Kreno et al., "Metal-Organic Framework Materials as Chemical Sensors", 2011, Chemical Reviews, 112, p. 1105-1125 (Year: 2011).*

(Continued)

*Primary Examiner* — Samuel P Siefke
*Assistant Examiner* — Henry H Nguyen
(74) *Attorney, Agent, or Firm* — Oblon, McClelland, Maier & Neustadt, L.L.P.

(57) ABSTRACT

The molecule detecting apparatus of an embodiment includes a light source 31, a fluorescent layer 42 emitting different fluorescence depending on the kind of a target molecule 60 captured when being irradiated with light from the light source 31, a photodetector 32 configured to detect fluorescence, and the photodetector 32 is an array of avalanche photodiodes operating in Geiger mode.

22 Claims, 11 Drawing Sheets

(51) Int. Cl.
    *C07F 3/06*         (2006.01)
    *H01L 31/107*       (2006.01)
    *G01N 21/77*        (2006.01)
    *G01J 1/44*         (2006.01)
    *B01J 20/22*        (2006.01)

(52) U.S. Cl.
    CPC ........... *H01L 31/107* (2013.01); *B01J 20/223* (2013.01); *G01J 2001/4466* (2013.01); *G01N 2021/6484* (2013.01); *G01N 2021/773* (2013.01); *G01N 2021/7763* (2013.01); *G01N 2021/7786* (2013.01)

(58) Field of Classification Search
    CPC ... G01N 2021/6484; G01N 2021/7786; G01N 21/645; G01N 2021/6434; G01N 2201/0634; C07F 3/06; H01L 31/107; B01J 20/223; G01J 2001/4466
    See application file for complete search history.

(56) References Cited

U.S. PATENT DOCUMENTS

| | | | |
|---|---|---|---|
| 2004/0101851 A1 | 5/2004 | White et al. | |
| 2004/0106211 A1* | 6/2004 | Kauer | G01N 21/85 436/169 |
| 2007/0121110 A1* | 5/2007 | Kralik | G01J 3/0218 356/318 |
| 2008/0211047 A1* | 9/2008 | Iida | H01L 27/14603 257/432 |
| 2009/0017553 A1* | 1/2009 | Hoying | G01N 21/6452 436/172 |
| 2010/0127153 A1* | 5/2010 | Agarwal | H01L 27/1446 250/200 |
| 2010/0170395 A1* | 7/2010 | Farha | C07C 63/331 95/139 |
| 2011/0039281 A1* | 2/2011 | Nunez Roldan | C12Q 1/48 435/7.92 |
| 2013/0060484 A1* | 3/2013 | Lee | B01J 20/226 702/24 |
| 2016/0276130 A1* | 9/2016 | Mele | H04N 5/32 |
| 2016/0313317 A1* | 10/2016 | Aslund | G01N 21/648 |
| 2018/0031420 A1 | 2/2018 | Dyba | |

FOREIGN PATENT DOCUMENTS

| | | | |
|---|---|---|---|
| JP | 2014-531032 A | 11/2014 | |
| JP | 5862046 B2 | 2/2016 | |
| JP | 5961016 B2 | 8/2016 | |
| JP | 2018-508970 A | 3/2018 | |
| JP | 2018-512673 A | 5/2018 | |
| JP | 2018-157156 A | 10/2018 | |
| WO | 2016/195080 A1 | 12/2016 | |
| WO | WO 2017/043068 A1 | 3/2017 | |
| WO | WO-2017094277 A1 * | 6/2017 | ......... H01L 31/0284 |

OTHER PUBLICATIONS

Lan et al., "A Luminescent Microporous Metal-Organic Framework for the Fast and Reversible Detection of High Explosives", 2009, Angew. Chem. Int. Ed., 48, p. 2334-2338 (Year: 2009).*
Translation of EP0354204A2, Feb. 7, 1990, Leiner, Marco Jean-Pierre Dr (Year: 1990).*
Translation of WO2017094277A1, Jun. 8, 2017, Natsuaki, Kazuhiro (Year: 2017).*

* cited by examiner

MOLECULE DETECTING APPARATUS

CROSS-REFERENCE TO RELATED APPLICATION

This application is based upon and claims the benefit of priority from Japanese Patent Application No. 2019-020741, filed on Feb. 7, 2019, the entire contents of which are incorporated herein by reference.

FIELD

Embodiments described herein relate generally to a molecule detecting apparatus.

BACKGROUND

Molecule detecting apparatuses are required to highly sensitively detect molecules.

DETAILED DESCRIPTION

Figure 1:
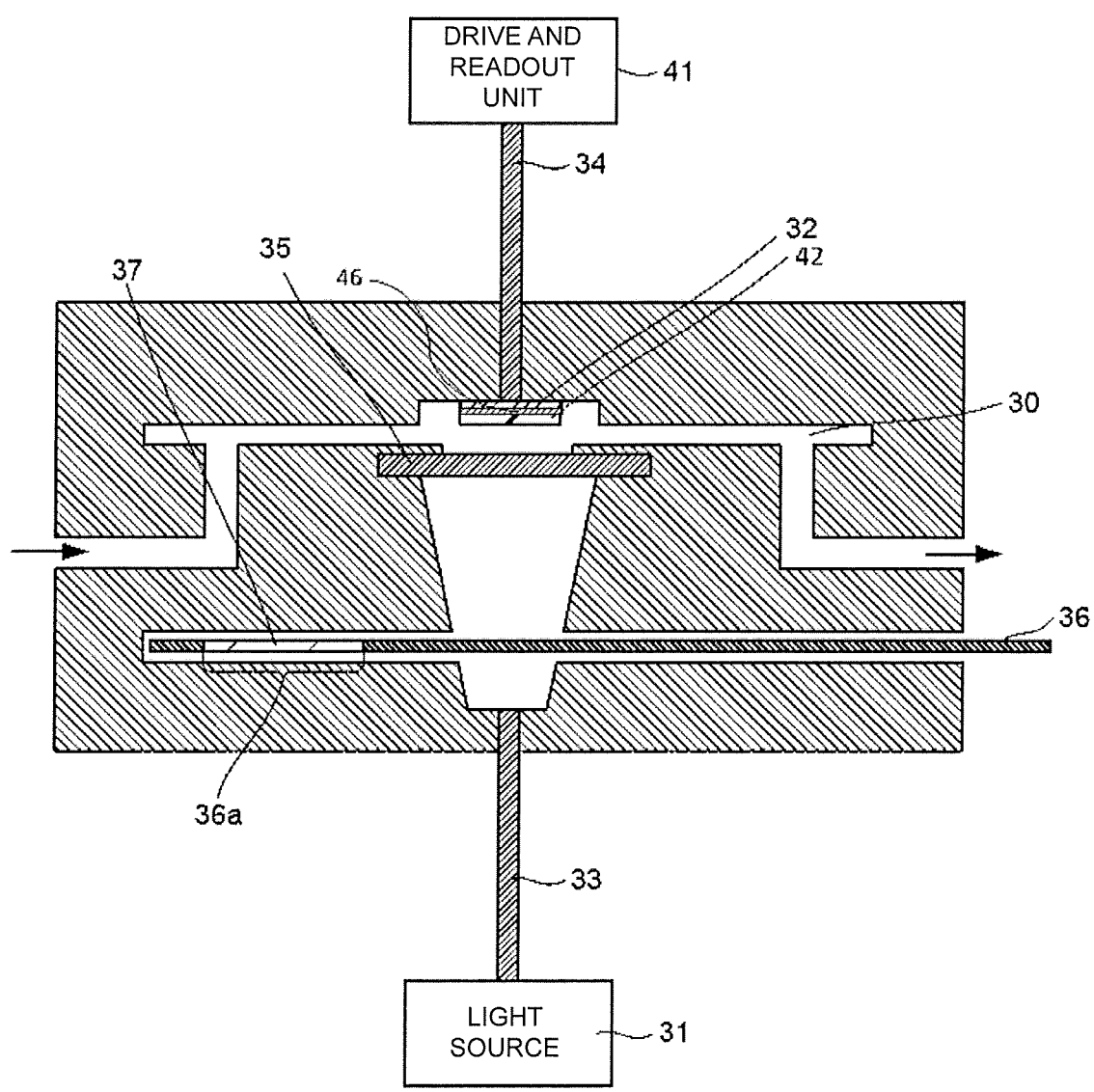
FIG. 1 is a diagram illustrating a molecule detecting apparatus according to a first embodiment.

Hereinafter, embodiments of the present disclosure will be described with reference to the drawings. Those denoted by the same reference numerals indicate corresponding ones. Incidentally, the drawings are schematic or conceptual drawings, and the relation between the thickness and width of each portion, the ratio of sizes between portions, and the like are not necessarily the same as the actual ones. In addition, even in the case of representing the same portion, the dimensions and ratios may be differently represented depending on the drawings.

First Embodiment

FIG. 1 is a cross-sectional diagram schematically illustrating a molecule detecting apparatus according to a first embodiment.

As illustrated in FIG. 1, the molecule detecting apparatus includes a flow channel 30 which is a flow channel of a target molecule 60 to be detected, a fluorescent layer 42 which emits different fluorescence depending on the kind of target molecule 60 captured when being irradiated with excitation light, a light source 31 which radiates excitation light for exciting the fluorescent layer 42, and an optical fiber 33 through which light from the light source 31 travels, a diffusion plate 35 which diffuses light from the optical fiber 33, a mechanical shutter 36 which is provided between the optical fiber 33 and the diffusion plate 35 and has an opening 36a through which light from the optical fiber 33 passes, a detector 32 which detects fluorescence emitted from the fluorescent layer 42, a wire 34 which wires an electric signal generated as fluorescence is detected by the detector 32, and an excitation light cut filter layer 46 which cuts excitation light from the light source 31. The excitation light from the light source 31 travels to the fluorescent body layer 42 through the optical fiber 33, the mechanical shutter 36, the diffusion plate 35, and the flow channel 30. The fluorescence emitted from the fluorescent body layer 42 travels to the photodetector 32 disposed close to or in contact with the fluorescent body layer 42. The fluorescence travelled to the photodetector 32 is converted to an electric signal by the photodetector 32. The electric signal converted is output to a drive and readout unit 41 through the wire 34.

The flow channel 30 is a space through which a fluid (not illustrated) containing the target molecule 60 flows. The arrows illustrated in FIG. 1 represent the flow direction of the fluid. This fluid contains the target molecule 60.

The diffusion plate 35 is provided between the light source 31 and the detector 32. In the case of using a point light source such as an LED light source as the light source 31, the area of the fluorescent body layer 42 irradiated with light can be increased by providing the diffusion plate 35. When the area of the fluorescent body layer 42 irradiated with light increases, the amount of fluorescence emitted from the fluorescent body layer 42 increases.

The mechanical shutter 36 has the opening 36a through which excitation light from the optical fiber 33 provided at a part of the mechanical shutter 36 passes, and the opening 36a is also slid when the mechanical shutter 36 is slid. If the opening 36a is on the track of the excitation light from the optical fiber 33, the excitation light can travel to the diffusion plate 35 through the opening 36a. If the opening 36a is not on the track of the excitation light from the optical fiber 33, the excitation light cannot travel to the diffusion plate 35. In addition, it is preferable that the opening 36a has an optical filter 37 which cuts light other than the excitation light. It is preferable that the optical filter 37 transmits light from the light source 31 but cuts light other than the excitation light so that, for example, light other than the excitation light is not transmitted through the fluorescent body layer 42 and detected by the detector 32.

The excitation light cut filter layer 46 is provided between the fluorescent body layer 42 and the photodetector 32. It is preferable that the excitation light cut filter layer 46 transmits the fluorescence emitted from the fluorescent body layer 42 but cuts the excitation light so that, for example, the excitation light is not detected by the photodetector 32. The material for the excitation light cut filter layer 46 is, for example, ITO or ZnO.

Figure 2:
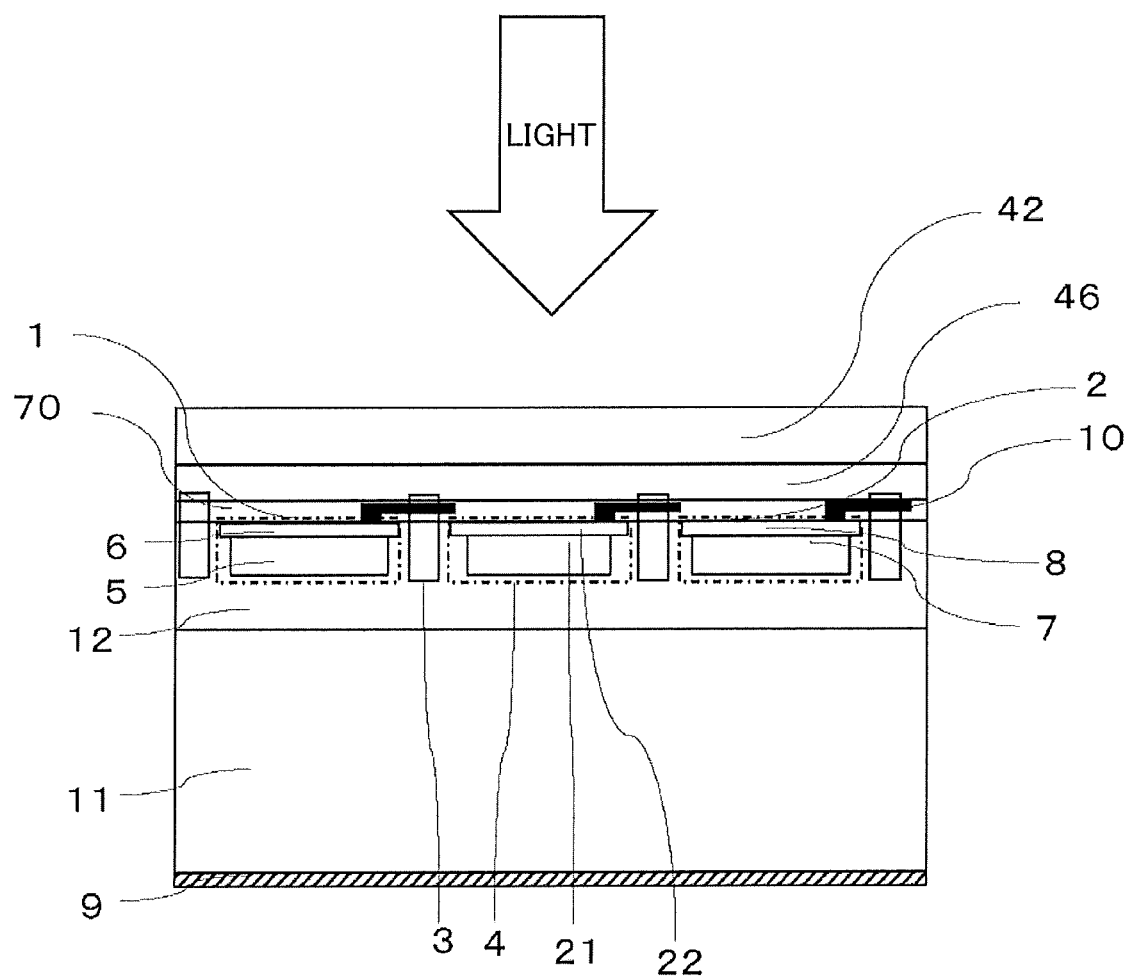
FIG. 2 is a cross-sectional diagram of a fluorescent body layer, a photodetector, and an excitation light cut filter layer in a configuration example of the molecule detecting apparatus according to the first embodiment illustrated in FIG. 1.

FIG. 2 is a cross-sectional diagram of the fluorescent body layer 42, the photodetector 32, and the excitation light cut filter layer 46 in the molecule detecting apparatus according to the first embodiment illustrated in FIG. 1.

As illustrated in FIG. 2, the excitation light cut filter layer 46 is provided between the fluorescent body layer 42 and the photodetector 32 to be in contact with the fluorescent body layer 42 and the photodetector 32. As the excitation light cut filter layer 46 is provided between the fluorescent body layer 42 and the photodetector 32 to be in contact with the fluorescent body layer 42 and the photodetector 32, the distance between the fluorescent body layer 42 and the photodetector 32 decreases and the fluorescence emitted from the fluorescent body layer 42 is likely to be incident on the photodetector 32.

The light source 31 may have, for example, a light bulb and a light emitting diode but is not limited to this. The wavelength of light from the light source 31 can be appropriately set in accordance with the characteristics of the detector 32.

The diffusion plate 35 is provided in order to diffuse light from the optical fiber 33 and to uniformly irradiate the fluorescent layer 42 with the light.

Figure 3:
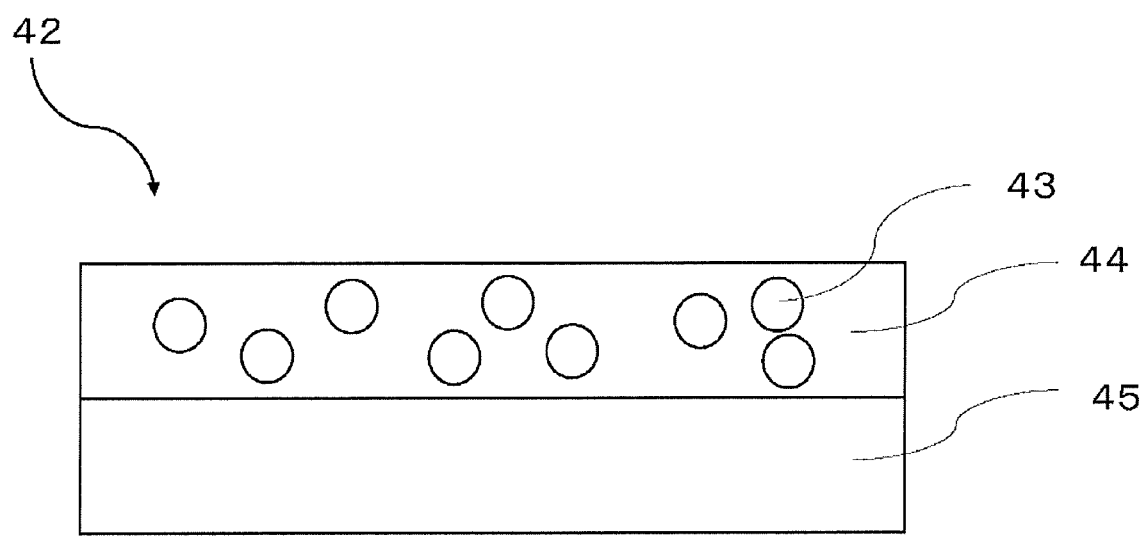
FIG. 3 is a diagram illustrating a fluorescent layer according to a first embodiment.

FIG. 3 is a diagram illustrating the fluorescent layer 42 according to the first embodiment.

The fluorescent layer 42 is a layer including a luminous body 43 which emits different fluorescence depending on the target molecule 60 captured, a translucent polymer layer 44 which contains a translucent polymer and in which the luminous body 43 is dispersed, and a substrate 45 provided to be in contact with the translucent polymer layer 44 in which the luminous body 43 is dispersed.

Figure 4:
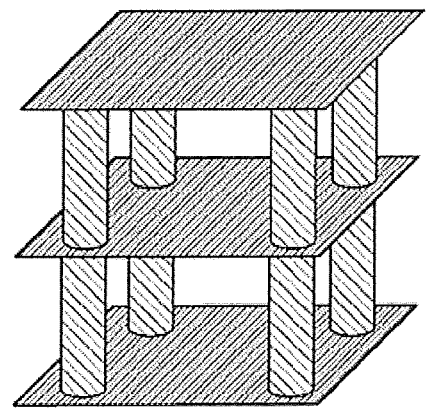
FIG. 4 is a schematic diagram illustrating an example of a pillared layered structure.

The luminous body 43 is, for example, a metal organic framework (MOF). MOF is a porous material having pores in nano order, can accommodate gas molecules such as $H_2$ and $CO_2$ in the pores at normal temperature and normal pressure, and thus is used, for example, as a detecting body of gas-storing materials and gas molecules. As MOF, for example, a fluorescent MOF which has a pillared layered structure and is illustrated in FIG. 4 is used as a detecting body of the target molecule 60. FIG. 4 is a schematic diagram illustrating an example of the pillared layered structure. The pillared layered structure refers to a three-dimensional structure which has a plurality of two-dimensional layered frameworks formed of a metal ion and a first ligand having a carboxyl group and in which the layered structures are crosslinked to each other by a second ligand having a pyridyl group, an imidazole group, or an amino group.

The metal ion is not particularly limited, but examples of the metal ion include at least one ion selected from the group consisting of a zirconium ion ($Zr^{4+}$), an aluminum ion ($Al^{3+}$), an iron ion ($Fe^{3+}$), a cobalt ion ($Co^{2+}$), a nickel ion ($Ni^{2+}$), a copper ion ($Cu^{2+}$), a zinc ion ($Zn^{2+}$), and a cadmium ion ($Cd^{2+}$).

Figure 5:
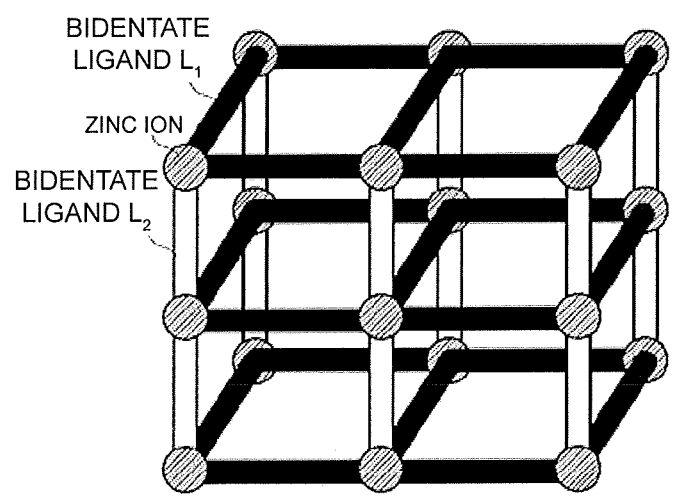
FIG. 5 is a diagram illustrating a fluorescent MOF having a pillared layered structure.

Examples of the fluorescent MOF having a pillared layered structure include MOF (also referred to as MOF1) having a zinc ion, a carboxylic acid-based bidentate ligand L1 bonded to the zinc ion, and a nitrogen-based bidentate ligand L2 such as a pyridyl group, an imidazole group, or an amino group as illustrated in FIG. 5. MOF1 in a state of not being coordinated with a solvent or a water molecule is represented by a general formula: $Zn_2(L1)_2(L2)$.

L1 represents at least one bidentate ligand selected from the group consisting of terephthalic acid, 2-aminoterephthalic acid, 2,6-naphthalenedicarboxylic acid, 2,5-furandicarboxylic acid, 2,5-thiophenedicarboxylic acid, 4,4-biphenyldicarboxylic acid, 9,10-anthracenedicarboxylic acid, 2,6-anthracenedicarboxylic acid, 9,10-bis(4-carboxyphenyl)anthracene, 2,7-pyrenedicarboxylic acid, 9-fluorene-2,7-dicarboxylic acid, 9-fluorenone-2,7-dicarboxylic acid, and 4,4'-stilbenedicarboxylic acid.

L2 represents at least one bidentate ligand selected from the group consisting of triethylenediamine, 4,4'-bipyridyl, 1,4-di(4-pyridyl)benzene, 3,6-di(4-pyridyl)-1,2,4,5-tetrazine, 1,2-di(4-pyridyl)ethane, 1,2-di(4-pyridyl)ethylene, and 1,4-bis[(1H-imidazol-1-yl)methyl]benzene.

A ligand which can realize a plurality of steric configurations without breaking the pillared layered structure as the ligand itself expands and contracts and the like is also referred to as a flexible ligand. Among the ligands, examples of particularly highly flexible ligand include 4,4'-stilbenedicarboxylic acid as L1 and 1,2-di(4-pyridyl)ethane, 1,2-di(4-pyridyl)ethylene, and 1,4-bis[(1H-imidazol-1-yl)methyl]benzene as L2. In the fluorescent MOF obtained by combining such flexible ligands, the unit cell can be flexibly deformed, the electronic state of the ligands or of the ligand and the metal ion is changed by π-π interaction and the like in association with such deformation, the interaction with a guest molecule (corresponding to the target molecule 60) is also added in some cases, and as a result, the emission spectrum of fluorescence is likely to be changed. For example, the fluorescence is quenched by the interaction with an aromatic nitro compound.

Next, a fluorescent MOF which has a pillared layered structure and is different from that described above will be described.

Figure 6:
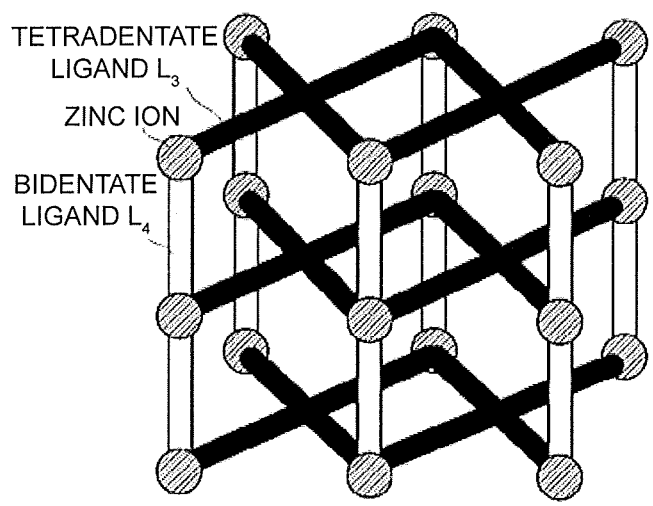
FIG. 6 is a diagram illustrating a fluorescent MOF having a pillared layered structure.

Other examples of the fluorescent MOF having a pillared layered structure include MOF (also referred to as MOF2) having a zinc ion, a tetradentate ligand L3 bonded to the zinc ion, and a bidentate ligand L4 as illustrated in FIG. 6. Examples of the fluorescent MOF2 having a pillared layered structure are represented by a general formula: $Zn_2(L3)(L4)$ in a state in which the fluorescent MOF2 is not coordinated with a solvent or a water molecule. The emission spectrum of fluorescence from the fluorescent MOF2 represented by the above general formula: $Zn_2(L3)(L4)$ is particularly greatly changed by the interaction with the target molecule 60 as compared to the emission spectrum of fluorescence from the fluorescent MOF1 represented by the general formula: $Zn_2(L1)_2(L2)$.

L3 represents at least one tetradentate ligand selected from the group consisting of 1,2,4,5-tetrakis(4-carboxyphenyl)benzene, 1,2,4,5-tetrakis(4'-carboxy[1,1'-biphenyl]-4-yl)benzene, tetrakis(4-carboxyphenyl)ethylene, tetrakis(4'-carboxy[1,1'-biphenyl]-4-yl)ethylene, 3,3',5,5'-tetra(4-carboxyphenyl)biphenyl, N,N,N',N'-tetrakis(4-carboxyphenyl)-biphenyl-4,4'-diamine, 1,3,6,8-tetra(4-carboxyphenyl)pyrene, and tetrakis(4-carboxyphenyl)porphyrin. In these tetradentate ligands, it is considered that even in a state in which four carboxyl groups and metal ions are bonded to each other, the angle of the radially extending bonded hand is flexibly changed like a hinge, the electronic state of the ligand or the ligand and the metal ion is changed, and as a result, the fluorescence emission spectrum is likely to be changed.

L4 represents at least one bidentate ligand selected from the group consisting of triethylenediamine, 4,4'-bipyridyl, 1,4-di(4-pyridyl)benzene, 3,6-di(4-pyridyl)-1,2,4,5-tetrazine, 1,2-di(4-pyridyl)ethane, 1,2-di(4-pyridyl)ethylene, and 1,4-bis[(1H-imidazol-1-yl)methyl]benzene. Among the bidentate ligands, examples of particularly highly flexible bidentate ligand include 1,2-di(4-pyridyl)ethane, 1,2-di(4-pyridyl)ethylene, and 1,4-bis[(1H-imidazol-1-yl)methyl]benzene.

In such a fluorescent MOF, the unit cell can be flexibly deformed, the electronic state of the ligands or of the ligand and the metal ion is changed in association with such a deformation, the interaction with a guest molecule is also added in some cases, and as a result, the fluorescence emission spectrum is likely to be changed.

Figure 7:
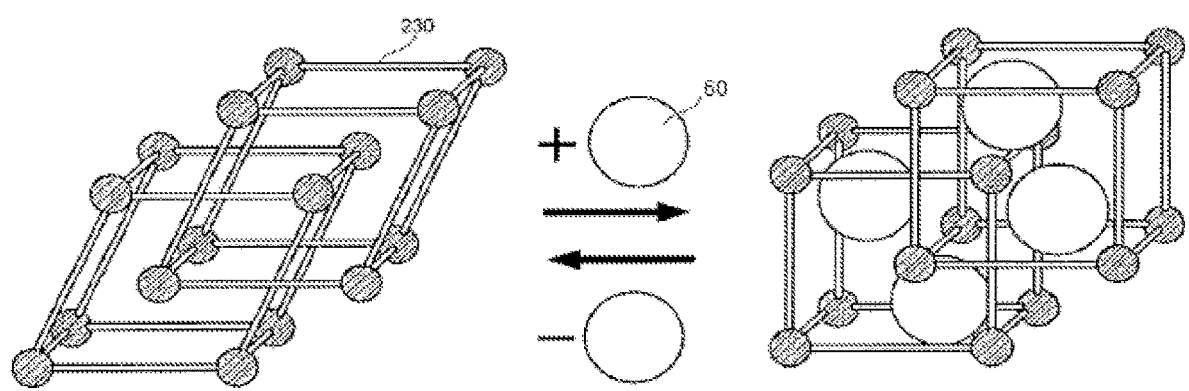
FIG. 7 is a schematic diagram for explaining a deformed example of the fluorescent MOF which has a pillared layered structure and is illustrated in FIG. 4.

FIG. 7 is a schematic diagram for explaining a deformed example of the fluorescent MOF which has a pillared layered structure and is illustrated in FIG. 5. A fluorescent MOF having a pillared layered structure often has a structure in which unit cells 230 of the fluorescent MOF are intertwined as illustrated in FIG. 7. In a case in which the unit cells are intertwined, the target molecule 60 is sandwiched between adjacent ligands, the lattice of the fluorescent MOF is thus deformed, and the lattice spacing is changed.

Figure 8:
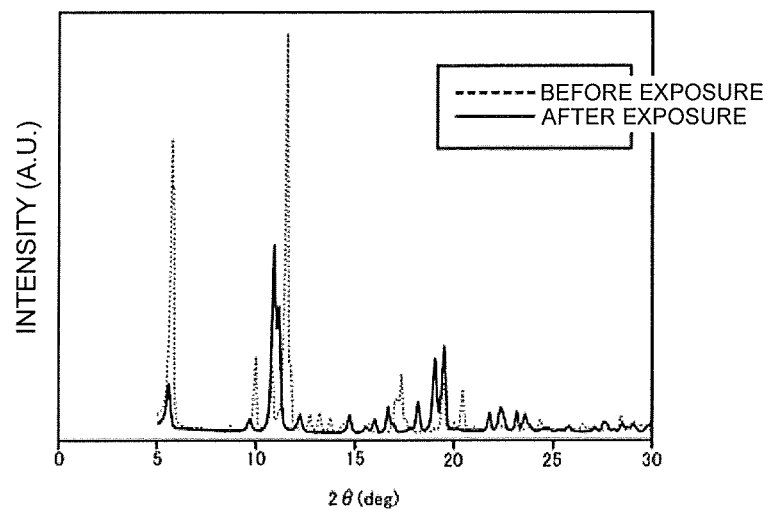
FIG. 8 is a diagram of an example of an X-ray diffraction pattern of a fluorescent MOF having a pillared layered structure.

The deformation and the change in lattice spacing can be confirmed from, for example, an X-ray diffraction (XRD) pattern. FIG. 8 is an example of the X-ray diffraction pattern of the fluorescent MOF having a pillared layered structure. In FIG. 8, the X-ray diffraction patterns of a fluorescent MOF having a zinc ion, a tetradentate ligand 2,4,5-tetrakis(4-carboxyphenyl)benzene, and a bidentate ligand 1,2-di(4-pyridyl)ethylene before and after being exposed to saturated vapor of heptane are illustrated. For example, the peak corresponding to 2θ=5.7 degrees and a lattice spacing of 15.5 angstroms, which is the highest intensity before exposure to heptane almost disappears after exposure to heptane, and the peak corresponding to 2θ=11 degrees and a lattice spacing of 8 angstroms is intensive. In other words, it can be seen that the spacing between unit cells of the fluorescent MOF having a pillared layered structure is greatly changed by the adsorption of heptane.

In the example mentioned here, L3 of the tetradentate ligand is a ligand having a carboxyl group at the terminal and L4 of the bidentate ligand is a ligand having a nitrogen-based substituent such as a pyridyl group, an imidazole group, or an amino group at the terminal, but conversely, L3 may be a ligand having a nitrogen-based substituent such as a pyridyl group, an imidazole group, or an amino group at the terminal and L4 may be a ligand having a carboxyl group at the terminal.

In this manner, the fluorescent MOF having a pillared layered structure is excited by light from the light source 31 and is deformed by the interaction with the target molecule 60 which is a guest molecule as well emits fluorescence. The emission spectrum of fluorescence from the fluorescent MOF is changed in accordance with the deformation. By utilizing the phenomenon, for example, a molecule detecting apparatus such as a VOC sensor or an explosive sensor can be configured. The change in the emission spectrum may include not only a difference with the parameters such as the emission intensity in the emission spectrum before the introduction of the target molecule 60 but also the time change in the parameters of the emission spectrum when the target molecule 60 is introduced for a certain period.

The fluorescent MOF having a pillared layered structure can take and concentrate the target molecule 60 in the pores even in a case in which the number of target molecules 60 is significantly small, and thus the target molecule 60 can be highly sensitively detected. In addition, the target molecule 60 adsorbed can be removed by heating or decompression, and thus the detector 32 can be repeatedly used. The fluorescent MOF having a pillared layered structure can cause an interaction in a solution or in a gas phase without using a solvent.

A great number of MOFs is not decomposed even when being heated to 300° C. or higher and exhibits high heat resistance. In addition, a fluorescent MOF to be used in a fluorescent body is generally a particle having a particle size of 10 nm or more and 100 μm or less.

The translucent polymer layer 44 is provided in order to prevent unwanted detachment or peeling off of the fluorescent MOF caused by being exposed to the target molecule 60. It is preferable that the translucent polymer exhibits high permeability to the target molecule 60 since the target molecule 60 is required to diffuse in the translucent polymer and to reach the fluorescent MOF particles. Specifically, the permeabilities to the respective gases of $CO_2$, $N_2$, $O_2$, $CH_4$, and $H_2$ at room temperature are all preferably $10 \times 10^{-10}$ ($cm^3$(STP)$cm/cm^2 \cdot s \cdot cmHg$) or more and still more preferably $100 \times 10^{-10}$ ($cm^3$(STP)$cm/cm^2 \cdot s \cdot cmHg$) or more.

As the translucent polymer in which the fluorescent MOF is dispersed, it is preferable that the transmittance of light is high in the excitation wavelength region and emission wavelength region of the fluorescent MOF and the durability with respect to light in the wavelength region is high. In order not to impair the function as the fluorescent body layer 42, the transmittance of light at the peak excitation wavelength and peak emission wavelength of the fluorescent MOF is 50% or more and more preferably 70% or more.

As described above, the fluorescent MOF has a flexible pillared layered structure and thus is likely to be deformed, and there is thus a possibility that the change in emission spectrum by the target molecule 60 is suppressed and the detection sensitivity is diminished when the fluorescent MOF is dispersed in a highly rigid translucent polymer. In addition, heating at 100° C. to 200° C. is effective in order to desorb the adsorbed target molecule 60 from the fluorescent MOF and to repeatedly use the fluorescent MOF, but the molecular chains flow by the heat and the dispersion state of the fluorescent MOF is changed although the degree is significantly slight in the case of using a thermoplastic polymer which does not exhibit rubber elasticity. The change in film quality as described above should be avoided in order to apply the fluorescent MOF to the detector 32 which detects a slight change in fluorescence emission spectrum. Hence, as the polymer in which the fluorescent MOF is dispersed, it is required to select a material which is flexible, exhibits rubber elasticity, returns to the original state even when being deformed, and exhibits excellent heat resistance. Consequently, the polymer is preferably a polymer which has a glass transition temperature of room temperature or less and still more preferably −50° C. or less so as to exhibit rubber elasticity and has a heat resistant temperature of 100° C. or more and still more preferably 150° C. or more.

As the translucent polymer in which the fluorescent MOF is dispersed, a silicone polymer containing an alkyl siloxane as a main component is preferable. When a silicone polymer is simply used as the translucent polymer, not only the fluorescent MOF is dispersed in the silicone polymer but also the alkyl silanol group or alkoxysilyl group present in the precursor of the silicone polymer causes an interaction with the metal ion constituting the fluorescent MOF. In addition, as described above, the change in film quality such as aggregation or detachment of the fluorescent MOF particles in the translucent polymer is less likely to occur by the interaction between the fluorescent MOF and the silicone polymer. This point is important in order to apply the fluorescent MOF to a sensor which detects a slight change in fluorescence emission spectrum. In addition, when the target molecule 60 is detached from the fluorescent body layer 42 by heating, the heat resistance may be improved as compared to the respective raw materials depending on the combination of MOF and the silicone material.

The silicone material is particularly highly gas permeable and does not inhibit the diffusion of the target molecule 60 into the translucent polymer layer 44. In addition, the silicone material is permeable to water vapor but exhibits water repellency against bulk water. For example, in the case of detecting substances contained in water, the fluorescent MOF in silicone is not exposed to bulk water, and thus even a fluorescent MOF material inferior in the durability in water (that is, likely to be subjected to ionic dissociation) can be used. In order to form such a fluorescent body layer 42, a general liquid silicone polymer may be mixed with the fluorescent MOF before being cured or at the stage of being semi-cured, applied in an appropriate thickness and an appropriate shape, and cured. As the liquid silicone polymer, commercially available one-component condensation type, two-component condensation type, one-component addition type, two-component addition type and the like can be used. As a coating method, mask coating, screen printing, spin coating, and other common coating and printing methods can be applied.

The thickness of the fluorescent body layer 42 is not particularly limited, but a range of 100 nm or more and 500 μm or less is preferable since a sufficient fluorescence intensity may not be attained when the thickness is less than 100 nm and it takes time for the target molecule 60 to diffuse inside the film and the response speed is sacrificed when the thickness exceeds 500 μm.

As the substrate 45, for example, a glass substrate and a polymer film which has a high visible light transmittance and does not exhibit fluorescent property are used. For example, a substrate on which a translucent conductive film such as indium tin oxide (ITO) is formed is used, the substrate 45 can be heated by application of electricity, and the target molecule 60 adsorbed to the fluorescent body layer 42 is desorbed by the heat. This makes it possible to repeatedly use the detector 32. Incidentally, it is not limited to the example in which a translucent conductive film is formed and electricity is applied to the translucent conductive film, and the target molecule 60 adsorbed to the fluorescent body layer 42 can also be desorbed by providing a heating apparatus which heats the fluorescent body layer 42, and the like.

Figure 9A:
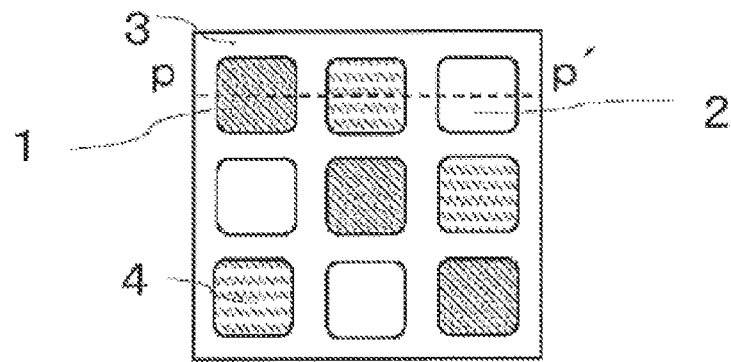
FIGS. 9A and 9B are diagrams illustrating the relation between light receiving sensitivities of a first light detecting element, a second light detecting element, and a third light detecting element and wavelengths of light incident on the respective light detecting elements.
Figure 9B:
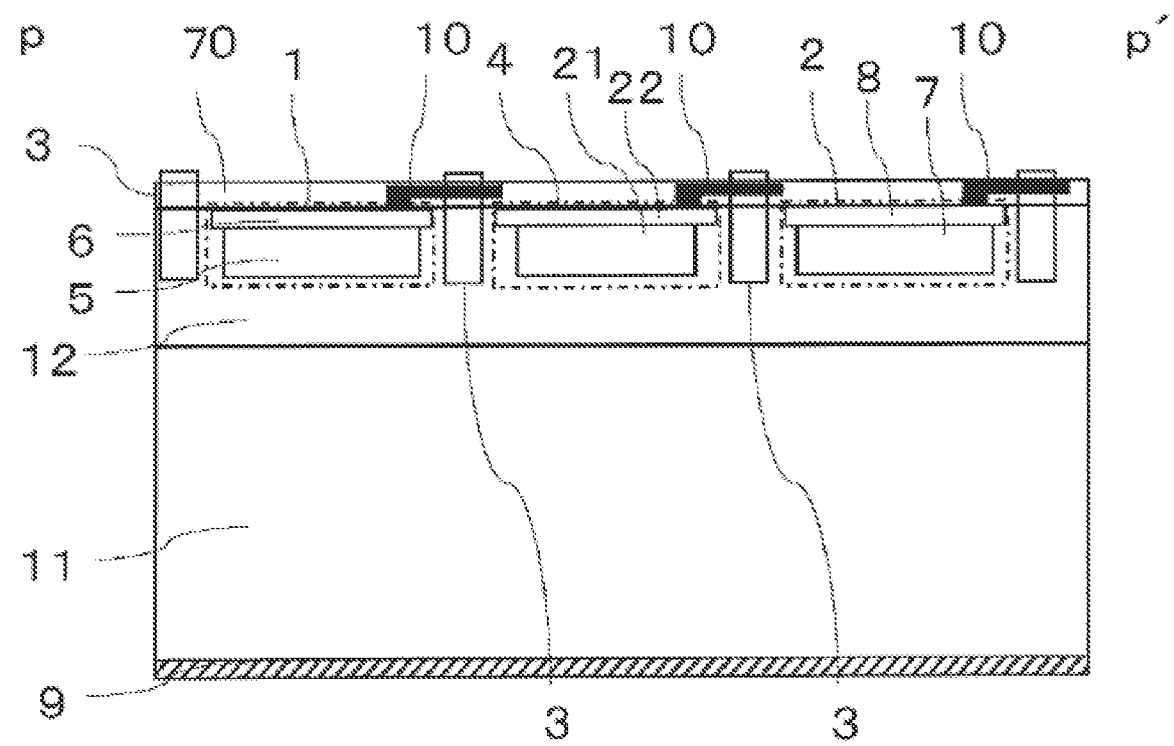

FIGS. 9A and 9B are diagrams illustrating the photodetector 32 according to the first embodiment.

As illustrated in FIG. 9A, the photodetector 32 includes a first light detecting element 1, a second light detecting element 2, a third light detecting element 4 provided between the first light detecting element 1 and the second light detecting element 2, and a non-light detected region 3 provided between the first light detecting element 1 and the second light detecting element 2, between the first light detecting element 1 and the third light detecting element 4, and between the second light detecting element 2 and the third light detecting element 4. The photodetector 32 is, for example, an array (SiPM: Silicon Photomultipliers) of avalanche photodiodes (APD) operating in Geiger mode.

The first light detecting element 1, the second light detecting element 2, and the third light detecting element 4 detect fluorescence emitted from MOF by converting the fluorescence into an electric signal. The first light detecting element 1, the second light detecting element 2, and the third light detecting element 4 are, for example, avalanche photodiodes. In addition, the first light detecting element 1, the second light detecting element 2, and the third light detecting element 4 have approximately the same opening area in the present embodiment. To be approximately the same in the present embodiment also includes an error of ±5%. The opening area refers to the area of the light detecting element surrounded by the non-light detected region 3 in the case of being viewed from the light incident side.

The non-light detected region 3 is a region in which the incident light cannot be detected. The non-light detected region 3 is also a region in which electrodes are present in order to wire the electric signals converted by the first light detecting element 1 and the second light detecting element 2 to the drive and readout unit (not illustrated in FIG. 8), respectively.

FIG. 9B is a diagram illustrating a p-p' cross section of the photodetector 32 illustrated in FIG. 9A.

As illustrated in FIG. 9B, the photodetector 32 includes a back surface electrode 9, a high-concentration p-type substrate 11 provided on the back surface electrode 9, and a p-type semiconductor layer 12 provided on the high-concentration p-type substrate 11. Here, the term "on" refers to the side on which light is incident. The side on which light is incident is the upper part in FIG. 9B.

The first light detecting element 1, the second light detecting element 2, and the third light detecting element 4 are alternately provided on the upper surface of the p-type semiconductor layer 12. Further, an electrode 10 electrically connected to the end portion of the upper surfaces of the first light detecting element 1, the second light detecting element 2, and the third light detecting element 4 and a protective layer 70 provided so as to cover this electrode 10 are provided. Here, the electrode 10 is also disposed in the non-light detected region 3 of FIGS. 9A and 9B.

For example, the first light detecting element 1 includes a p+-type semiconductor layer 5 (corresponding to the first semiconductor layer) and an n+-type semiconductor layer 6 (corresponding to the second semiconductor layer) provided on the light incident side of the p+-type semiconductor layer 5, and the interface between the p+-type semiconductor layer 5 and the n+-type semiconductor layer 6 forms a pn junction. The width of the n+-type semiconductor layer 6 is larger than the width of the p+-type semiconductor layer 5 in the direction intersecting the stacking direction. Here, the term "intersection" means to be substantially orthogonal in the present embodiment. The electrode 10 is electrically connected to the end portion of the upper surface of the n+-type semiconductor layer 6 of the first light detecting element 1.

For example, the second light detecting element 2 includes a p+-type semiconductor layer 7 (corresponding to the third semiconductor layer) and an n+-type semiconductor layer 8 (corresponding to the fourth semiconductor layer) provided on the light incident side of the p+-type semiconductor layer 7, and the interface between the p+-type semiconductor layer 7 and the n+-type semiconductor layer 8 forms a pn junction. The width of the n+-type semiconductor layer 8 is larger than the width of the p+-type semiconductor layer 7 in the direction intersecting the stacking direction. The electrode 10 is electrically connected to the end portion of the upper surface of the n+-type semiconductor layer 8 of the second light detecting element 2.

For example, the third light detecting element 4 includes a p+-type semiconductor layer 21 (corresponding to the fifth semiconductor layer) and an n+-type semiconductor layer 22 (corresponding to the sixth semiconductor layer) provided on the light incident side of the p+-type semiconductor layer 21, and the interface between the p+-type semiconductor layer 21 and the n+-type semiconductor layer 22 forms a pn junction. The width of the n+-type semiconductor layer 22 is larger than the width of the p+-type semiconductor layer 21 in the direction intersecting the stacking direction. The electrode 10 is electrically connected to the end portion of the upper surface of the n+-type semiconductor layer 22 of the third light detecting element 4.

The difference among the first light detecting element 1, the second light detecting element 2, and the third light detecting element 4 is that the peak concentration in the stacking direction of the n+-type semiconductor layer 6 is larger than the peak concentration in the stacking direction of the n+-type semiconductor layer 8 and the peak concentration in the stacking direction of the n+-type semiconductor layer 8 is larger than the peak concentration in the stacking direction of the n+-type semiconductor layer 22. With regard to the peak concentration of the embodiment, an impurity concentration profile is created by subjecting a cross section obtained by cutting the photodetector 32 of the embodiment to secondary ion mass spectrometry (SIMS) and the concentration at the top of the largest peak in the concentration profile is taken as the peak concentration.

The depths of the p+-type semiconductor layers 5, 7, and 21 can be adjusted by changing the acceleration energy for ion implantation. The p+-type semiconductor layer can be formed deeper when the acceleration energy for ion implantation is increased.

The p+-type semiconductor layers 5, 7, and 21 are obtained by, for example, implanting boron (B) into silicon.

The n+-type semiconductor layers 6, 8, and 22 can be obtained by, for example, implanting an impurity of phosphorus (P), antimony (Sb), or arsenic (As) into silicon. In the present embodiment, the n+-type semiconductor layers 6, 8, and 22 have approximately the same impurity concentration and approximately the same thickness.

The electrode 10 and the back surface electrode 9 (the electrode 10 and the back surface electrode 9 are also collectively referred to as the wire 34) apply a voltage to the p+-type semiconductor layers 5, 7, and 21 and the n+-type semiconductor layers 6, 8, and 22, drive the first light detecting element 1, the second light detecting element 2, and the third light detecting element 4, and output the electric signals photoelectrically converted between the p+-type semiconductor layers 5, 7 and 21 and the n+-type semiconductor layers 6, 8 and 22 to the drive and readout unit (omitted in the drawing). The materials for the electrode 10 and back surface electrode 9 are, for example, aluminum or an aluminum-containing material, copper or a copper-containing material, gold or a gold-containing material, ITO, or other metal materials combined with these materials.

The protective layer 70 is provided for a role of protecting the electrode 10 from coming into contact with the outside and short circuiting. The material for the protective layer 70 is, for example, a silicon oxide film, a nitride film, or a laminated film of these.

Figure 10:
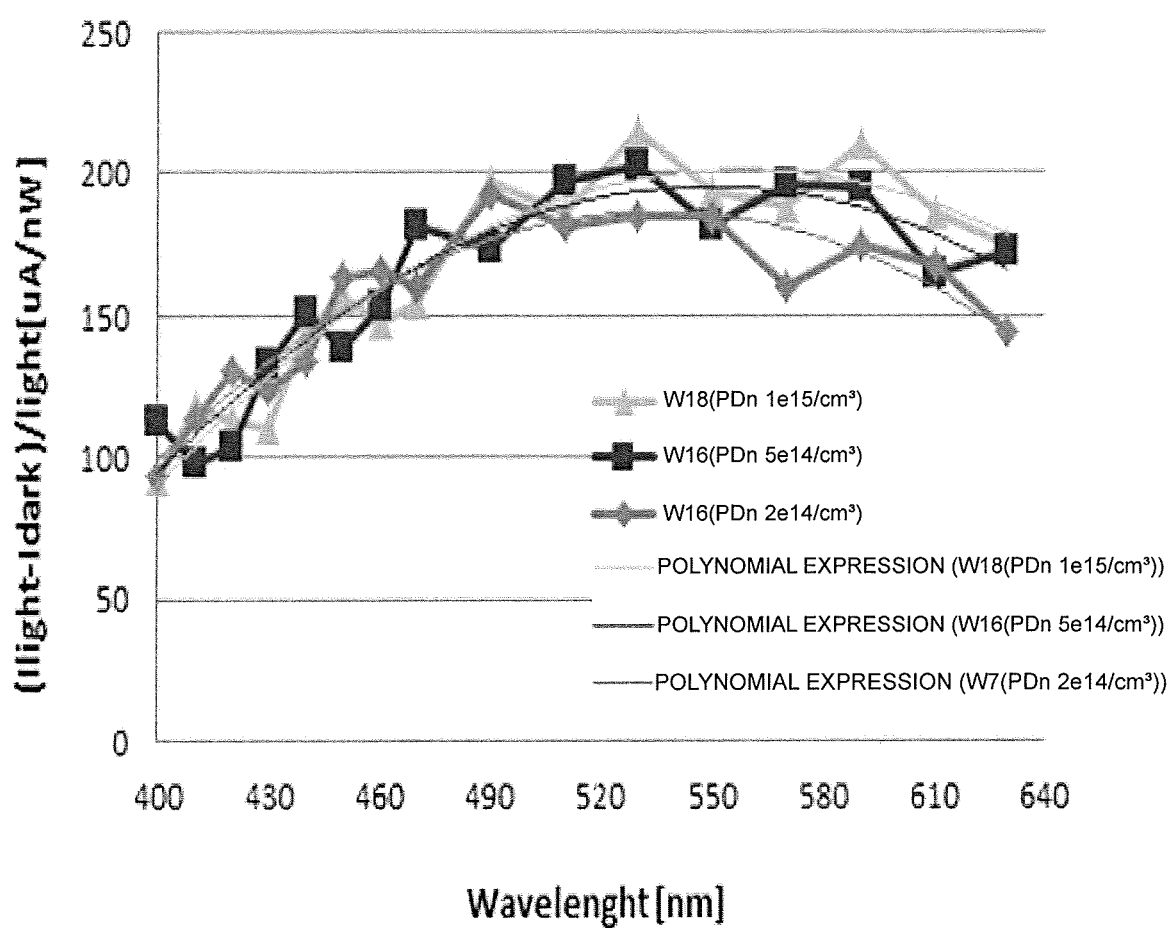
FIG. 10 is a diagram illustrating the relation between a peak concentration of an n+-type semiconductor layer and a light receiving sensitivity peak.

FIG. 10 is a diagram illustrating the relation between the light receiving sensitivities of the first light detecting element 1, the second light detecting element 2, and the third light detecting element 4 and the wavelengths of light incident on the respective light detecting elements. Incidentally, the peak concentration of the n+-type semiconductor layer 6 is, for example, $2e14/cm^3$, the peak concentration of the n+-type semiconductor layer 8 is $5e14/cm^3$, and the peak concentration of the n+-type semiconductor layer 22 is $1e15/cm^3$.

As illustrated in FIG. 10, it can be seen that the light receiving sensitivity peak shifts to the longer wavelength side as the peak concentration of the n+-type semiconductor layer increases.

Next, a method for detecting the kind of molecule will be described.

Figure 11A:
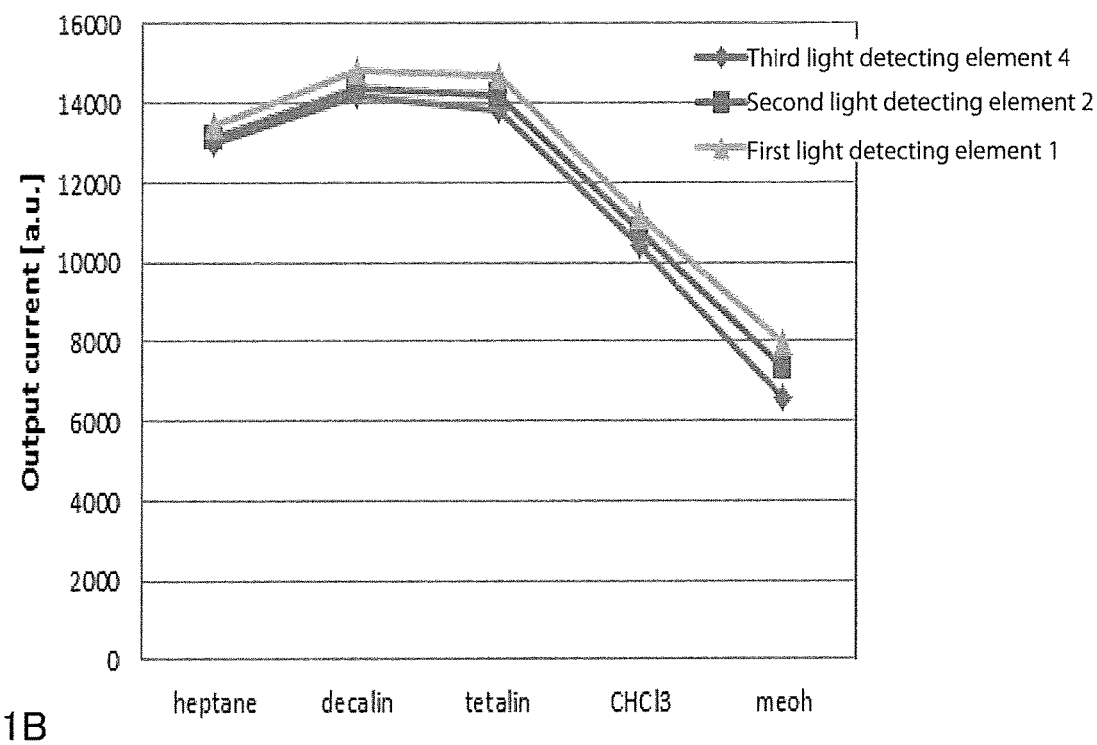
FIGS. 11A and 11B are diagrams illustrating that a light detecting element detects light when MOF has captured a target molecule and has emitted fluorescence.

FIG. 11A is a diagram illustrating the current flowing when MOF has captured heptane, decalin, tetalin, $CHCl_3$, and methanol (meoh) and has emitted fluorescence and the light detecting elements 1, 2, and 4 have respectively received the light. Incidentally, Vov is 5 V.

Figure 11B:
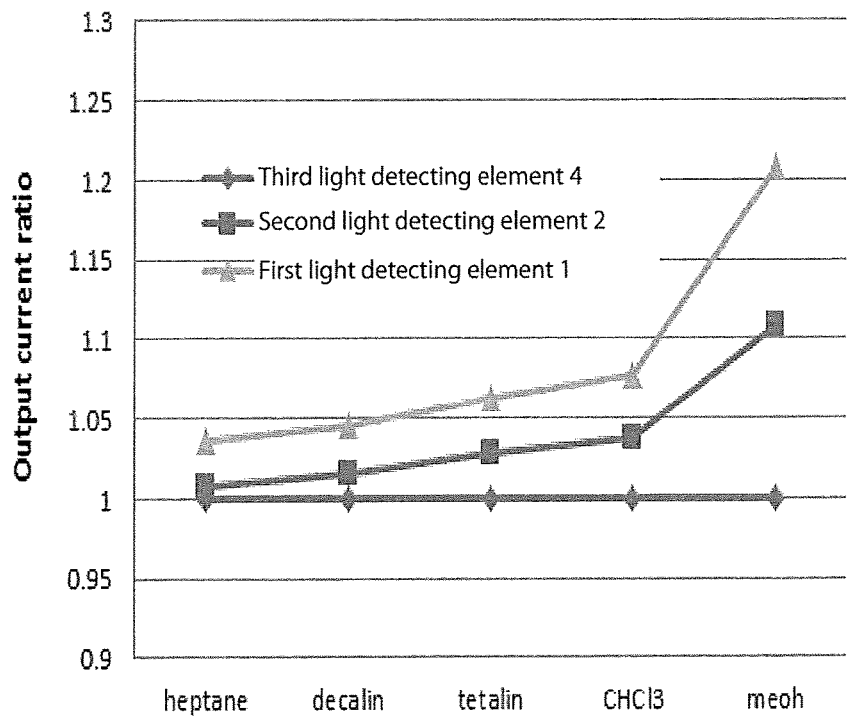

In addition, FIG. 11B is a diagram illustrating the current ratio in a case in which the current value of the third light detecting element 4 in FIG. 11A is set to 1.

As illustrated in FIG. 11B, the pattern of current ratio different depending on the kind of target molecule 60 is taken, and thus the kind of target molecule 60 can be detected by perceiving this pattern.

The molecule detecting apparatus according to the first embodiment realizes highly sensitive detection even in the case of weak fluorescence as SiPM is used. In addition, it is possible to miniaturize the molecule detecting apparatus by decreasing (or integrating) the distance between the SiPM and the fluorescent body layer 42. Furthermore, the molecule detecting apparatus exhibits highly sensitive property to a specific wavelength as a part of the light detecting element included in SiPM is fabricated under different ion implantation conditions from those for other light detecting elements, and the molecule detecting apparatus can thus highly sensitively detect various fluorescence wavelengths from the fluorescent body layer 42.

Incidentally, in the example described above, the peak concentration of the n+-type semiconductor layer is changed to change the light receiving sensitivity of the light detecting element, but the same effect as described above can be attained even when the peak concentration of the p+-type semiconductor layer is changed. In addition, the same effect as described above can be attained even when the depth in which the n+-type semiconductor layer and/or the p+-type semiconductor layer are formed in the stacking direction is changed. Furthermore, the same effect as described above can be attained even when both the peak concentration and the depth in which the n+-type semiconductor layer and/or the p+-type semiconductor layer are formed are changed.

In addition, regardless of FIGS. 9A and 9B, the SiPM may be a SiPM including at least two light detecting elements having different light receiving sensitivities from each other.

While certain embodiments have been described, these embodiments have been presented by way of example only, and are not intended to limit the scope of the inventions. Indeed, molecule detecting apparatus described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A molecule detecting apparatus comprising:
    a fluorescent layer emitting different fluorescence depending on a kind of a target molecule captured when being irradiated with light; and
    a photodetector configured to detect fluorescence,
    wherein the photodetector includes an array of avalanche photodiodes, the array of avalanche photodiodes includes a first avalanche photodiode and a second avalanche photodiode, the first avalanche photodiode has first light receiving sensitivity, the second avalanche photodiode has second light receiving sensitivity, and the first light receiving sensitivity is different from the second light receiving sensitivity, and wherein the fluorescent layer contains a metal organic framework having pores in nano order configured to accommodate gas molecules, and having a plurality of two-dimensional layered frameworks formed of a metal ion and a first ligand having a carboxyl group and the layered frameworks are crosslinked to each other by a second ligand having a pyridyl group, an imidazole group, or an amino group.

2. The molecule detecting apparatus according to claim 1, wherein an excitation light cut filter is provided between the fluorescent layer and the photodetector to be in contact with the fluorescent layer and the photodetector.

3. The molecule detecting apparatus according to claim 1, wherein the fluorescent layer further contains a translucent polymer.

4. The molecule detecting apparatus according to claim 3, wherein a permeability of the translucent polymer to $CO_2$, $N_7$, $O_2$, $CH_4$, and $H_2$ at room temperature is $10\times10^{-10}$ $(cm^3(STP)cm/cm^2 \cdot s \cdot cmHg)$ or more.

5. The molecule detecting apparatus according to claim 3, wherein the translucent polymer includes a silicone polymer.

6. The molecule detecting apparatus according to claim 1, wherein impurity concentrations in the first avalanche photodiode and the second avalanche photodiode are different from each other.

7. The molecule detecting apparatus according to claim 1, wherein depths of impurities in the first avalanche photodiode and the second avalanche photodiode are different from each other.

8. The molecule detecting apparatus according to claim 1, wherein
the first avalanche photodiode includes a first semiconductor layer and a second semiconductor layer provided on the first semiconductor layer,
the second avalanche photodiode includes a third semiconductor layer and a fourth semiconductor layer provided on the third semiconductor layer, and
a peak concentration of the second semiconductor layer is larger than a peak concentration of the fourth semiconductor layer.

9. The molecule detecting apparatus according to claim 8, wherein
the first semiconductor layer and the third semiconductor layer contain a first-conductivity type impurity, and
the second semiconductor layer and the fourth semiconductor layer contain a second-conductivity type impurity.

10. The molecule detecting apparatus according to claim 8, wherein
a width of the second semiconductor layer is larger than a width of the first semiconductor layer, and
a width of the fourth semiconductor layer is larger than a width of the third semiconductor layer.

11. The molecule detecting apparatus according to claim 8, wherein
the array of avalanche photodiodes further includes a third avalanche photodiode including a fifth semiconductor layer and a sixth semiconductor layer provided on the fifth semiconductor layer, and
a peak concentration of the fourth semiconductor layer is larger than a peak concentration of the sixth semiconductor layer.

12. The molecule detecting apparatus according to claim 11, wherein
the fifth semiconductor layer contains a first-conductivity type impurity, and
the sixth semiconductor layer contains a second-conductivity type impurity.

13. The molecule detecting apparatus according to claim 1, wherein the first avalanche photodiode and the second avalanche photodiode operate in Geiger mode.

14. The molecule detecting apparatus according to claim 1, wherein the fluorescent layer further contains a heating apparatus.

15. The molecule detecting apparatus according to claim 1, further comprising:
a light source radiating the light for exciting the fluorescent layer.

16. The molecule detecting apparatus according to claim 1, wherein the metal ion is at least one ion selected from the group consisting of a zirconium ion, an aluminum ion, an iron ion, a cobalt ion, a nickel ion, a copper ion, a zinc ion, and a cadmium ion.

17. The molecule detecting apparatus according to claim 1, wherein
the metal ion is a zinc ion,
the first ligand is at least one bidentate ligand selected from the group consisting of terephthalic acid, 2-aminoterephthalic acid, 2,6-naphthalenedicarboxylic acid, 2,5-furandicarboxylic acid, 2,5-thiophenedicarboxylic acid, 4,4-biphenyldicarboxylic acid, 9,10-anthracenedicarboxylic acid, 2,6-anthracenedicarboxylic acid, 9,10-bis(4-carboxyphenyl)anthracene, 2,7-pyrenedicarboxylic acid, 9-fluorene-2,7-dicarboxylic acid, 9-fluorenone-2,7-dicarboxylic acid, and 4,4'-stilbenedicarboxylic acid, and
the second ligand is at least one bidentate ligand selected from the group consisting of triethylenediamine, 4,4'-bipyridyl, 1,4-di(4-pyridyl)benzene, 3,6-di(4-pyridyl)-1,2,4,5-tetrazine, 1,2-di(4-pyridyl)ethane, 1,2-di(4-pyridyl)ethylene, and 1,4-bis[(1H-imidazol-1-yl) methyl]benzene.

18. The molecule detecting apparatus according to claim 1, wherein the metal organic framework has a zinc ion, a tetradentate ligand bonded to the zinc ion, and a bidentate ligand.

19. The molecule detecting apparatus according to claim 18, wherein
the tetradentate ligand is at least one tetradentate ligand selected from the group consisting of 1,2,4,5-tetrakis (4-carboxyphenyl)benzene, 1,2,4,5-tetrakis(4'-carboxy [1,1'-biphenyl]-4-yl)benzene, tetrakis(4-carboxyphenyl)ethylene, tetrakis(4'-carboxy[1,1'-biphenyl]-4-yl) ethylene, 3,3',5,5'-tetra(4-carboxyphenyl)biphenyl, N,N,N',N'-tetrakis(4-carboxyphenyl)-biphenyl-4,4'-diamine, 1,3,6,8-tetra(4-carboxyphenyl)pyrene, and tetrakis(4-carboxyphenyl)porphyrin, and
the bidentate ligand is at least one bidentate ligand selected from the group consisting of triethylenediamine, 4,4'-bipyridyl, 1,4-di(4-pyridyl)benzene, 3,6-di (4-pyridyl)-1,2,4,5-tetrazine, 1,2-di(4-pyridyl)ethane, 1,2-di(4-pyridyl)ethylene, and 1,4-bis[(1H-imidazol-1-yl)methyl]benzene.

20. The molecule detecting apparatus according to claim 1, wherein unit cells of the metal organic framework are intertwined in a chain shape.

21. The molecule detecting apparatus according to claim 1, wherein the first light receiving sensitivity is different from the second light receiving sensitivity because a first wavelength of a first light receiving sensitivity peak of the first light receiving sensitivity is different from a second wavelength of a second light receiving sensitivity peak of the second light receiving sensitivity.

22. A molecule detecting apparatus comprising:
- a fluorescent layer emitting different fluorescence depending on a kind of a target molecule captured when being irradiated with light; and
- a photodetector configured to detect fluorescence,
- wherein the photodetector includes an array of avalanche photodiodes, the array of avalanche photodiodes includes a first avalanche photodiode and a second avalanche photodiode, the first avalanche photodiode has first light receiving sensitivity, the second avalanche photodiode has second light receiving sensitivity, and the first light receiving sensitivity is different from the second light receiving sensitivity,
- wherein the fluorescent layer further contains a translucent polymer, and
- wherein a permeability of the translucent polymer to $CO_2$, $N_2$, $O_2$, $CH_4$, and $H_7$ at room temperature is $10 \times 10^{-10}$ ($cm^3$(STP)cm/$cm^2$·s·cmHg) or more.

* * * * *